United States Patent [19]

Leonard

[11] 4,271,364

[45] Jun. 2, 1981

[54] BISTABLE HYSTERETIC INTEGRATED CIRCUIT

[75] Inventor: Mark Leonard, Los Altos, Calif.

[73] Assignee: Hewlett-Packard Company, Palo Alto, Calif.

[21] Appl. No.: 963,724

[22] Filed: Nov. 27, 1978

[51] Int. Cl.³ .............................................. H03K 5/24
[52] U.S. Cl. ................................... 307/355; 307/289; 307/303
[58] Field of Search ............... 307/289, 291, 311, 355, 307/DIG. 3, 303

[56] References Cited

U.S. PATENT DOCUMENTS

| 4,032,801 | 6/1977 | Fulkerson | 307/355 X |
| 4,147,944 | 4/1979 | Monticelli | 307/355 X |

Primary Examiner—John Zazworsky
Attorney, Agent, or Firm—A. C. Smith; Edward Y. Wong

[57] ABSTRACT

A bistable hysteretic integrated circuit is designed such that the hysteretic characteristic is determined by the ratio of the resistances of two resistors.

10 Claims, 4 Drawing Figures

BISTABLE HYSTERETIC INTEGRATED CIRCUIT

BACKGROUND AND SUMMARY OF THE INVENTION

The accurate reproduction of a precise hysteretic characteristic when using integrated circuits has been difficult to achieve in previous encoders because of the difficulty in accurately repeating the exact characteristics of junctions and resistors in integrated circuits. To overcome this problem, the described encoder incorporates a hysteretic circuit in which the hysteretic characteristic is determined by the ratio of two resistors rather than by their absolute values. Since the ratio between resistors on an integrated circuit can be accurately controlled, a repeatable hysteretic integrated circuit having a precise hysteretic characteristic is obtained.

DESCRIPTION OF THE PREFERRED EMBODIMENT

Figure 1:
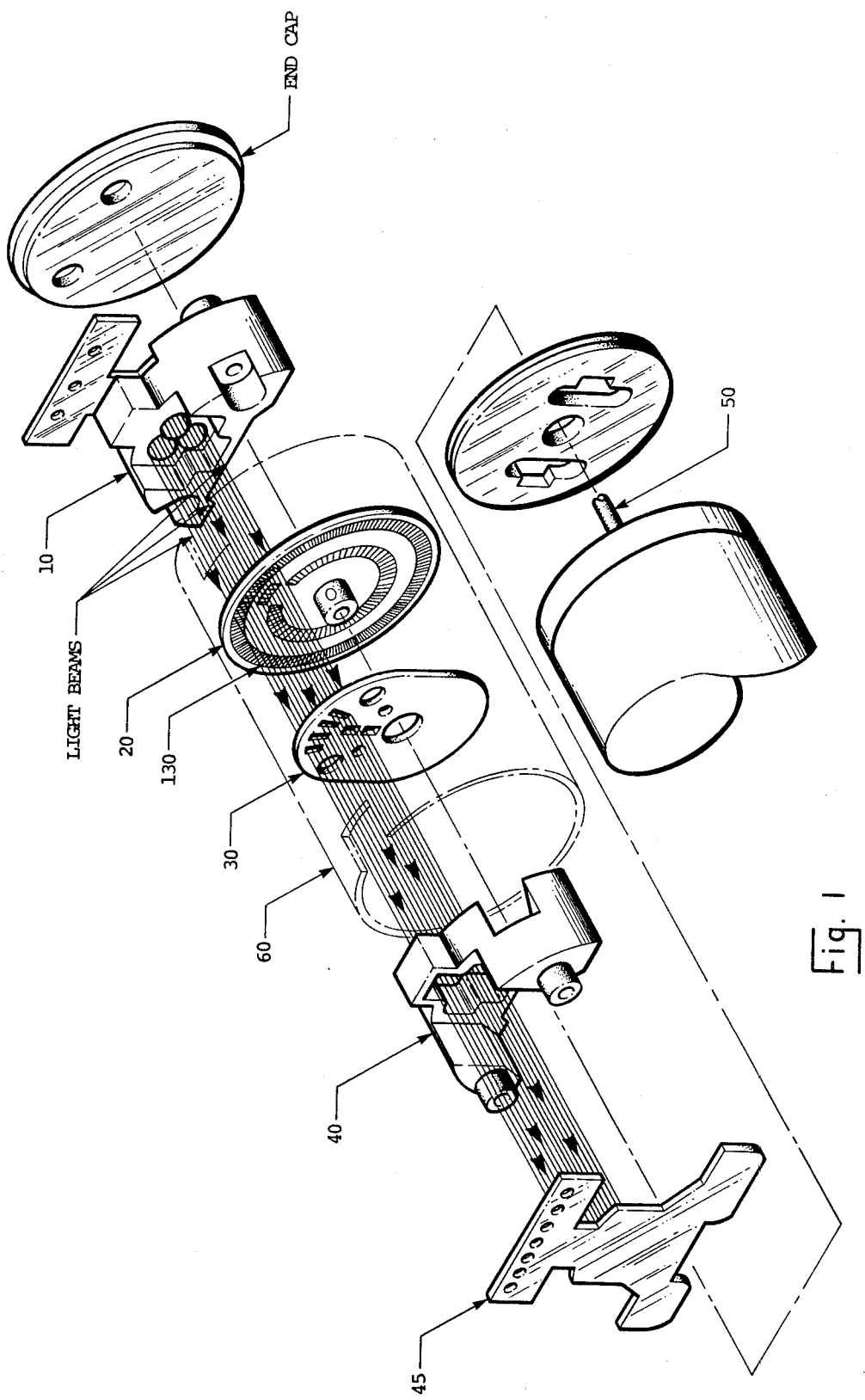
FIG. 1 is an exploded perspective view of a shaft angle encoder.

An exploded view of a shaft encoder using the comparator circuit in accordance with the present invention is illustrated in FIG. 1. In the figure, three collimated light beams are provided by emitter module 10 and are modulated by a code wheel 20 and a fixed phase plate 30. The modulated light beams are split and focused by a detector module 40 and directed to photo detectors on circuit board 45. The photo detectors are coupled to comparator circuits for providing digital and analog output signals responsive to the relative angle between the code wheel and the phase plate. It is these comparator circuits on circuit board 45 that are described in detail in the following discussion.

Current Reference and Control Circuits

Figure 3:
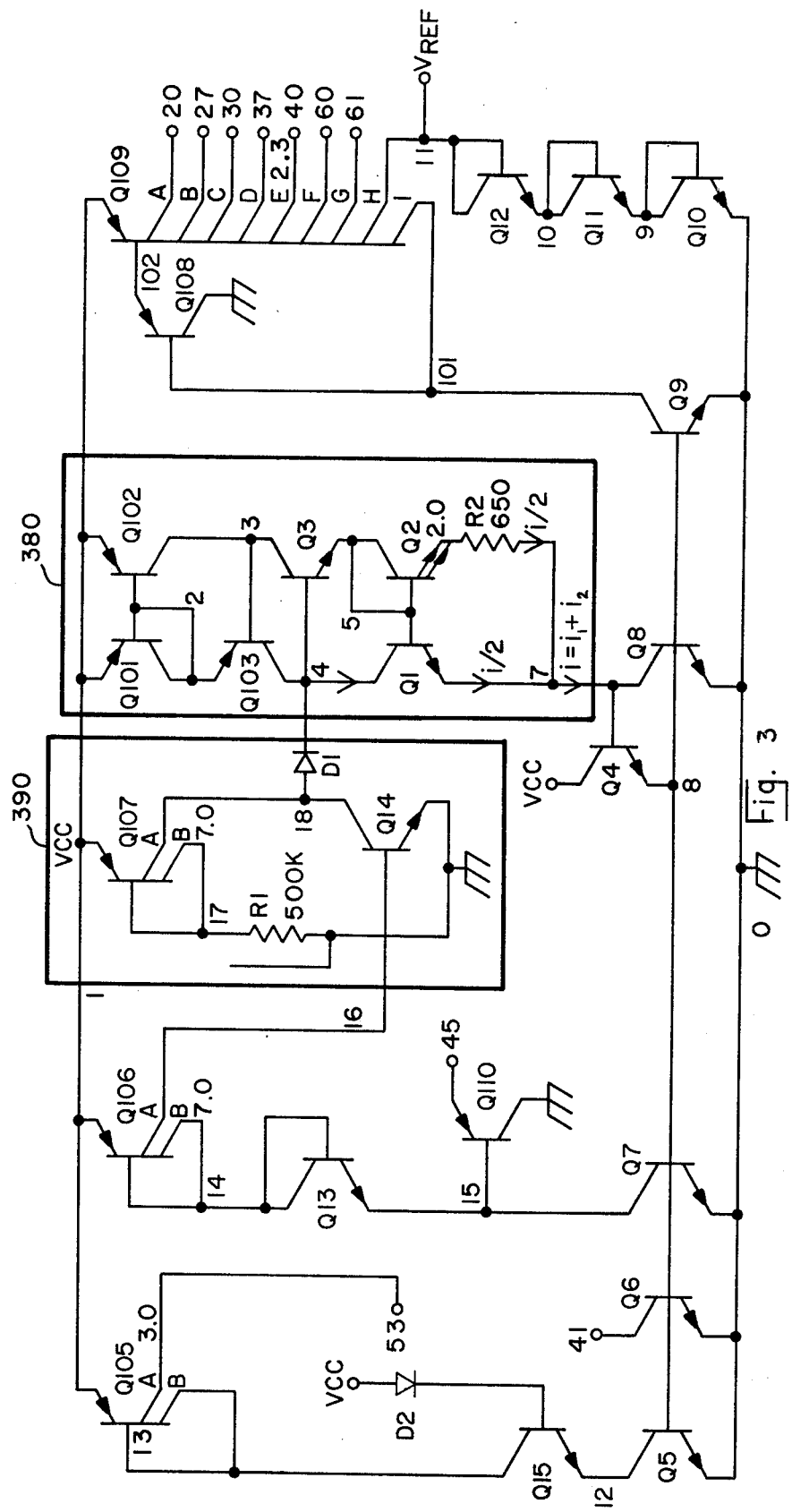
FIG. 3 is a detailed schematic diagram of the current reference circuit for the optical comparator of FIG. 2.

Basic to the comparator circuits is a current reference circuit 380 as illustrated in FIG. 3.

The basic current reference circuit 380 is made up of transistors Q1, Q2, Q3, Q101, Q102, Q103 and resistor R2. PNP resistors Q101, Q102 and Q103 form a Wilson current mirror, which injects a current into node 4 equal to the current passing through node 3, thus "mirroring" the former current to the latter. This portion of the circuit acts as a current controller to define the currents passing through Q1 and Q2. Q103 improves the accuracy of the basic mirror by increasing the output impedance and compensating for the base current of Q101 and Q102. Transistors Q1, Q2 and Q3 form a similar Wilson current mirror except that transistor Q2 has twice the active area of Q1 and has a resistor R2 in its emitter circuit. This mirror draws a current from node 3 responsive to the current into node 4. At low current, the voltage drop across R2 is small. Thus, for equal emitter-base voltages, transistor Q2 will generate a current twice that of transistor Q1, and the current through node 3 from the NPN current mirror is twice that through node 4. The PNP current mirror will sense the higher current from transistor Q2 and continue to increase the current through transistor Q1 and node 4. This current will again be multiplied by transistor Q2 until the current through R2 causes a voltage drop across R2 which reduces the emitter-base voltage of Q2 in an amount sufficient to limit the current from transistor Q2 by a factor of one-half. The voltage drop across R2 which corresponds to this 2:1 current change is approximately 16 millivolts at room temperature. Thus, the current through resistor R2 is equal to V/R, where V is the voltage required to reduce the emitter-base voltage of Q2 by an amount sufficient to compensate for the difference in areas between transistor Q1 and Q2 and R is the resistance of resistor R2. In the preferred embodiment, the current through each transistor is about 25 microamps and the output current i is approximately 50 microamps.

A startup circuit 390 is provided to ensure that the basic current reference circuit 380 does not stabilize at a zero current. Resistor R1 produces a small current into PNP mirror Q107 which provides current through diode D1 into node 4. Mirror Q107 returns only one-seventh of its input current; this minimizes power consumption. Once the current reference circuit is operating properly, Q14 turns on, which pulls node 18 to a low level and diode D1 isolates the bias loop from the start-up circuit.

Transistor Q14 is driven with a nominal 7 microamp current generated by the 1:7 mirror Q106. Q106 is driven by a transistor Q7. A current generated by transistor Q7 is also used to bias Q110, the output analog clamp, which is coupled to transistor Q106 and diode connected transistor Q13 to set node 15 to $2V_{be}$ below VCC. This sets the base voltage for transistor Q110, which will conduct if its emitter rises above VCC minus $V_{be}$.

The basic current reference circuit 380 provides a 50 microamp current into node 7. The voltage at node 7 will increase until transistor Q4 provides enough current to node 8 to cause transistor Q8 to conduct essentially all of the 50 microamps from current reference 380. The current through Q8 is replicated in transistors Q5, Q6, Q7, and Q9, since the bases of these transistors are coupled to node 8 and the emitters of these transistors are coupled together at node 0. These transistors, in turn, act as sources and sinks for currents substantially equal to the 50 microamp output current of Q8. In other words, Q8 is a current replicator to cause the current sources and sinks tied to it to conduct substantially the same amount of current. The current from the collector of Q9 is coupled in a similar manner to transistor Q108 and transistor Q109 to provide a number of outputs from Q109 which conduct nominal 50 microamp currents. Thus, the source or sink currents controlled by transistors Q5, Q6, Q7, Q9, and Q109 are all affected by any choice of R2. See the discussion on the output amplifier, infra.

A logic pull-up current is generated by transistor Q105. Transistor Q105 is driven by transistor Q5. To further isolate this logic pull-up current from the current reference circuit 380, transistor Q15 is cascaded with transistor Q5 and biased by diode D2. This pull-up current has an amplitude of approximately 150 microamps.

The voltage reference, $V_{ref}$, is developed across diode connected transistors Q10, Q11 and Q12 by a 50 microamp current from transistor Q109.

Output Amplifier

Figure 2:
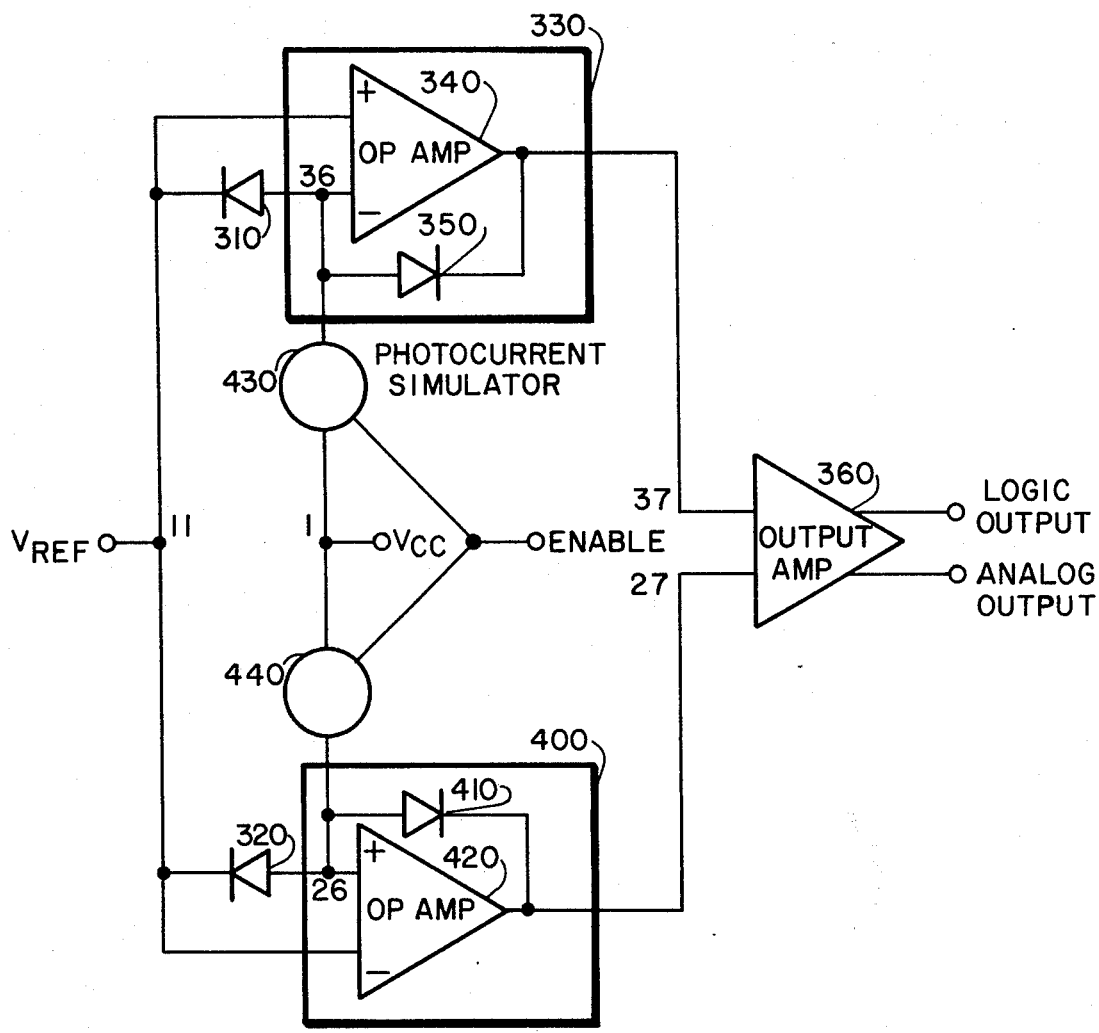
FIG. 2 is a general block diagram of an optical comparator.
Figure 4:
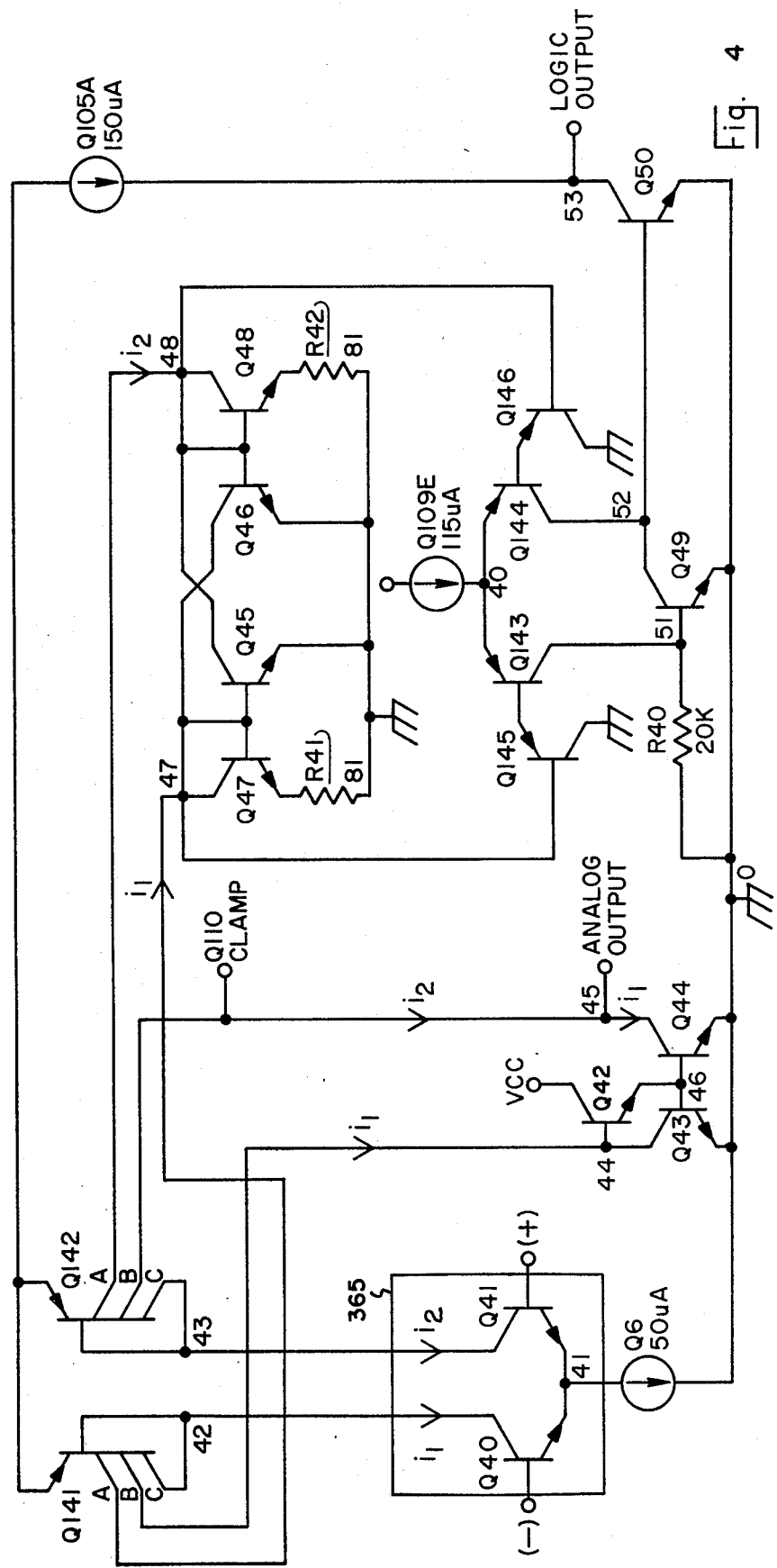
FIG. 4 is a detailed schematic diagram of the output amplifier of the optical comparator of FIG. 2.

Output amplifier 360 in FIG. 2 is shown in further detail in the schematic diagram FIG. 4. The outputs from operational amplifiers 340 and 420 are coupled to the bases of transistors Q41 and Q40 respectively. These transistors form a differential pair 365 and are matched in size and geometry to the diode connected transistors 350 and 410 in the feedback loops of transimpedance amplifiers 330 and 400 of FIG. 2. The transformation of voltage to current in differential pair 365 is the inverse of the transformation accomplished by the transimpedance amplifiers. Therefore, the ratio of photo currents detected by photodiodes 310 and 320 is converted into a voltage difference by the transimpedance amplifiers and converted back to a current ratio by transistors Q40 and Q41. The collector currents of transistors Q40 and Q41 have the same ratio as the photo currents. However, the sum of the collector currents is the nominal 50 microamps provided by current source Q6. Thus, assuming that two optical signals are generated by a same light source, the currents out of the differential pair Q40 and Q41 will reflect only the ratio of the two optical path losses, e.g., the position of a shaft in a system like that illustrated in FIG. 1.

The currents I1 and I2 from differential pair Q40 and Q41 are mirrored by PNP transistors Q141 and Q142. The mirrored current I1 from terminal B of transistor Q141 is mirrored again by transistors Q42, Q43, and Q44 to provide a current sink having a magnitude I1. The mirrored current I2 from terminal B of transistor Q142 provides a current source having a magnitude I2. These two currents, one a source and the other a sink, are coupled at terminal 45. If the two currents are equal, no net current is provided to terminal 45. However, if the two currents are not equal, the result is a net current either into or out of terminal 45. This analog current signal is the difference between the two currents whose sum is constant and whose ratio is the same as the ratio of the original photo currents. That is:

$$I_{out} = (X-Y) \div (X+Y) \times 50 \text{ microamps.}$$

where X and Y are the photo currents in photodetectors 310 and 320 respectively. If the photo currents are linearly related to a shaft position, the output current $I_{out}$ is also linearly related to the shaft position.

A logic output signal is provided to indicate which of the two photo currents is greater. This logic output signal is characterized by hysteresis which requires that the driving signal go past a point of equality before the output logic switches. Near the ideal switching point, a portion of the circuit is bistable. In FIG. 4, transistors Q141 and Q142, described above, provide currents I1 and I2 which represent the photo currents at terminals Q141A and Q142A. Transistors Q45 and Q46 are cross-coupled and form a hysteretic switching circuit that is bistable, viz., a bistable flip-flop. The currents I1 and I2 from transistors Q141 and Q142 are coupled to the flip-flop to provide the opposing set and reset currents. Diode connected transistors Q47 and Q48 reduce the effective gain of transistors Q45 and Q46 to a value slightly greater than 1, i.e., approximately 1.1. The flip-flop is thus a pair of current mirrors, with each mirror stealing control current from the other. Transistors Q47 and Q48 have resistors R41 and R42 in their respective emitter circuits. These resistors increase the base voltage to transistors Q45 and Q46. Thus, each side of the flip-flop can sink slightly more current than its input, thereby providing the hysteresis. Resistors R41 and R42 have one-eighth the value of resistor R2. The amount of current through source Q6 is controlled in effect by R2 via current replicator Q8. Therefore, R2 also controls the amount of current through the flip-flop circuit, since the currents in that circuit are currents mirroring those passing through Q40 and Q41 to current source Q6. Since resistor R41 determines the base bias voltage to Q45, and since the current through R41 in effect is determined by resistor R2, the amount of hysteresis in this circuit is controlled by the resistor ratio R41 divided by R2 and not by any absolute resistor values. The circuit in effect operates as follows: transistor Q47 conducts as much current as transistor Q2 at the switching point of the flip-flop circuit, i.e., when I1 approximately equals I2. Since resistor R41 has one-eighth the resistance of R2, but carries the same current, the voltage drop across R41 is one-eighth the voltage drop across resistor R2. And since the current through a transistor is an exponential function of the applied voltage, and the voltage developed across R2 equals the voltage difference corresponding to a 2:1 current ratio, the voltage drop across resistor R41 corresponds to a (2) exp. (R41/R42) or $\sqrt{2}$ current ratio. Transistor Q45 has a base-to-emitter voltage greater than the base-to-emitter voltage of transistor Q47 by the amount equal to the voltage drop across resistor R41. Thus, the current through transistor Q45 is approximately $\sqrt{2} \times I_1$, or approximately $1.09 I_1$. This means that at the operating point, mirror Q45 can sink 9% more current than the input mirror current to Q47. Thus, $I_2$ must exceed $I_1$ by approximately $(1.09-1) I_1$ or 9% before the flip-flop changes state. In this manner, hysteresis is accomplished. Together, transistors Q46 and Q48, forming a current mirror, and resistor R42 operate in a similar manner to provide hysteresis during the reverse change of state when Q46 is switched. The amount of hysteresis is reduced by the finite beta of the transistors, but the change of state will be abrupt even if the currents vary slowly so long as the transistors Q45 and Q46 can sink more current than I1 and I2 respectively.

The state of the Q45–Q46 hysteretic switching circuit becomes the logical output signal. This output signal is sensed by the output circuit formed by differential pair Q143 and Q144 and buffered by transistors Q145 and Q146. The current from source Q109E is switched to drive either transistor Q49 or Q50. Transistor Q49 is provided to speed the turn off of transistor Q50. When Q50 is off, the output is pulled to a high voltage level by transistor Q105A. Resistor R40 helps to turn transistor Q49 to its non-conductive state.

I claim:

1. A bistable hysteretic integrated circuit comprising:
   current reference means including a first resistor for providing a reference current;
   signal means coupled to the current reference means for producing, in response to first and second input signals applied thereto, first and second signal currents having a sum responsive to the reference current; and
   hysteretic switch means including a second resistor and being coupled to the signal means for providing a logical switched state representative of the first and second signal currents, the first and second signal currents differing one from another by a preselected factor determined by a ratio of the first and second resistors.

2. A bistable hysteretic integrated circuit as in claim 1 wherein:
said current reference means includes:
(a) first semiconductor junction coupled in series with said first resistor to provide a first bias voltage to a second semiconductor junction coupled thereto; and
(b) current control means coupled to the first and second semiconductor junctions for establishing a predefined relationship between the currents flowing through the first and second semiconductor junctions;
said signal means is coupled to the current reference means for producing, in response to first and second input signals applied thereto, first and second signal currents having a sum responsive to the currents through the first and second semiconductor junctions; and
said hysteretic switch means includes:
(a) first current mirror means having a third semiconductor junction coupled in series with said second resistor to provide a second bias voltage to a fourth semiconductor junction coupled thereto, the third semiconductor junction being coupled to receive the first signal current and the fourth semiconductor junction being coupled to receive the second signal current; and
(b) second current mirror means having fifth semiconductor junction coupled in series with a third resistor to provide a third bias voltage to a sixth semiconductor junction coupled thereto, the fifth semiconductor junction being coupled to receive the second signal current and the sixth semiconductor junction being coupled to receive the first signal current; and said bistable hysteretic integrated circuit further comprising an output means coupled to at least one of the current mirror means for providing a logiclal output signal responsive to the conduction of current through said first and second switch means.

3. A bistable hysteretic integrated circuit as in claim 2 wherein the third and fourth semiconductor junctions are matched and wherein the fifth and sixth semiconductor junctions are matched.

4. A bistable hysteretic integrated circuit as in claim 3 wherein the fourth and sixth semiconductor junctions are junctions of integrated transistors.

5. A bistable hysteretic integrated circuit as in claim 4 wherein the second and third resistors have equal values less than the value of the first resistor.

6. A bistable hysteretic integrated circuit as in claim 5 wherein the value of the first resistor is a predetermined multiple of the value of the second and third resistors.

7. A bistable hysteretic integrated circuit as in claim 6 wherein the value of the first resistor is eight times the value of the second and third resistors.

8. A bistable hysteretic integrated circuit as in claim 5 or 6 or 7 wherein the base of the transistor providing the fourth semiconductor junction is coupled to receive the first signal current and the base of the transistor providing the sixth semiconductor junction is coupled to receive the second signal current.

9. A bistable hysteretic integrated circuit as in claim 8 wherein the area of the first semiconductor junction is a predefined multiple of the area of the second semiconductor junction.

10. A bistable hysteretic integrated circuit as in claim 9 wherein the area of the first semiconductor junction is twice the area of the second semiconductor junction.

* * * * *

UNITED STATES PATENT AND TRADEMARK OFFICE
CERTIFICATE OF CORRECTION

PATENT NO. : 4,271,364
DATED : June 2, 1981
INVENTOR(S) : Mark Leonard

It is certified that error appears in the above-identified patent and that said Letters Patent are hereby corrected as shown below:

Column 2, line 26, "bias loop" should read -- current reference circuit 380 --;

Column 3, lines 66 and 67, "voltage" should read -- voltages --;

Column 4, line 24, " $\sqrt{2}$ " should read -- $\sqrt[8]{2}$ --; line 24, "Transistior" should read -- Transistor --; line 28, " $\sqrt{2} \times I_1$ " should read -- $\sqrt[8]{2} \times I_1$ --; line 32, after "before" insert -- Q45 switches and --;

Column 5, line 28, after "having" insert -- a --;

Column 6, line 3, "logiclal" should read -- logical --.

Signed and Sealed this

Fifteenth Day of September 1981

[SEAL]

Attest:

GERALD J. MOSSINGHOFF

Attesting Officer

Commissioner of Patents and Trademarks